United States Patent [19]

Meuche

[11] Patent Number: 5,226,964

[45] Date of Patent: Jul. 13, 1993

[54] VERTICAL SOLDER COATING APPARATUS

[75] Inventor: Howard O. Meuche, Fort Branch, Ind.

[73] Assignee: Monitriol, Inc., Vincennes, Ind.

[21] Appl. No.: 736,496

[22] Filed: Jul. 26, 1991

[51] Int. Cl.$^5$ .............................................. B05C 3/02
[52] U.S. Cl. .................................. 118/424; 118/425; 118/429; 228/40; 228/20; 239/590.3; 239/597
[58] Field of Search ................. 118/424, 425, 429, 63, 118/316; 228/38, 40, 20; 239/590.3, 597, 590, 568, 561

[56] References Cited

U.S. PATENT DOCUMENTS

| | | | |
|---|---|---|---|
| 970,134 | 9/1910 | Szabo | 118/424 |
| 3,016,041 | 1/1962 | Oganowski et al. | 118/424 |
| 3,599,877 | 8/1971 | Goldschmied | 239/568 |
| 4,083,323 | 4/1978 | Rote | 118/425 |
| 4,414,914 | 11/1983 | Caratsch | 118/63 |
| 4,563,974 | 1/1986 | Price | 118/425 |
| 4,599,966 | 7/1986 | Lymn | 118/425 |
| 4,619,841 | 10/1986 | Schwerin | 228/40 |
| 4,635,584 | 1/1987 | Obermann | 118/429 |

Primary Examiner—Joye L. Woodard
Attorney, Agent, or Firm—Cahill, Sutton & Thomas

[57] ABSTRACT

A vertical solder coating machine is described incorporating a tank containing molten solder with a bath of solder leveling fluid on the top thereof. Drive rollers are positioned within the tank and in the solder leveling fluid for grasping workpieces such as a printed circuit board and lowering the workpiece through the solder leveling fluid into the molten solder. The workpiece is forced into the molten solder until it is no longer gripped by the drive rollers and is trapped in the space formed by the rollers in contact with each other. When the rollers reverse direction, the workpiece is withdrawn through the solder leveling fluid and past a pair of leveling tubes positioned in the bath on either side of the workpiece. The leveler tubes direct a stream of solder leveling fluid onto the surface of the workpiece to level the solder thickness and remove solder from within any through-holes in the workpiece. The drive rollers are tapered and thus contact the workpiece only along opposite edges thereof.

11 Claims, 5 Drawing Sheets

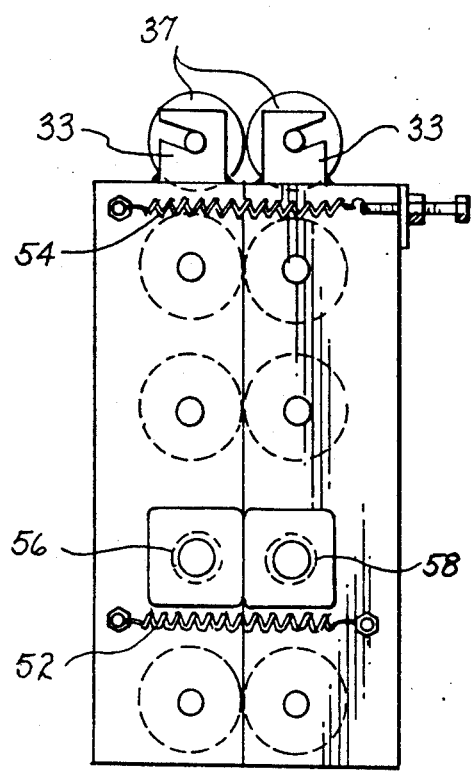
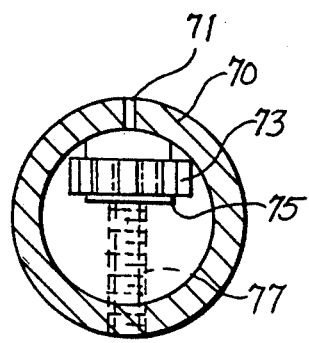
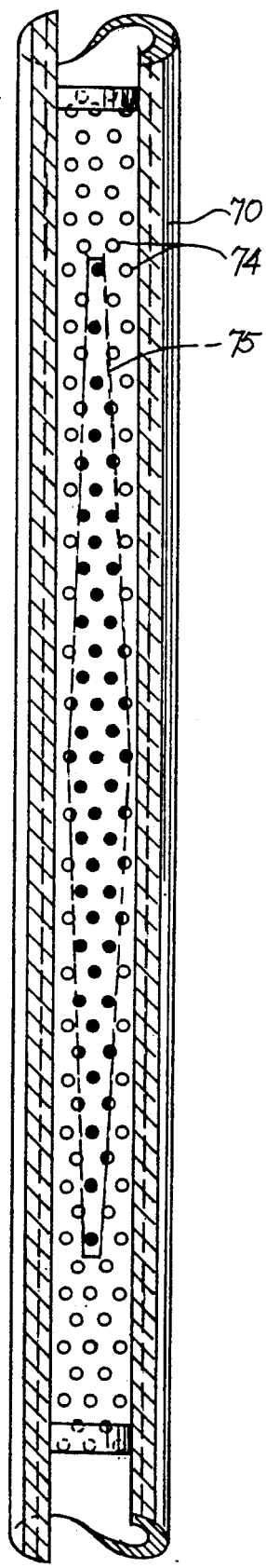
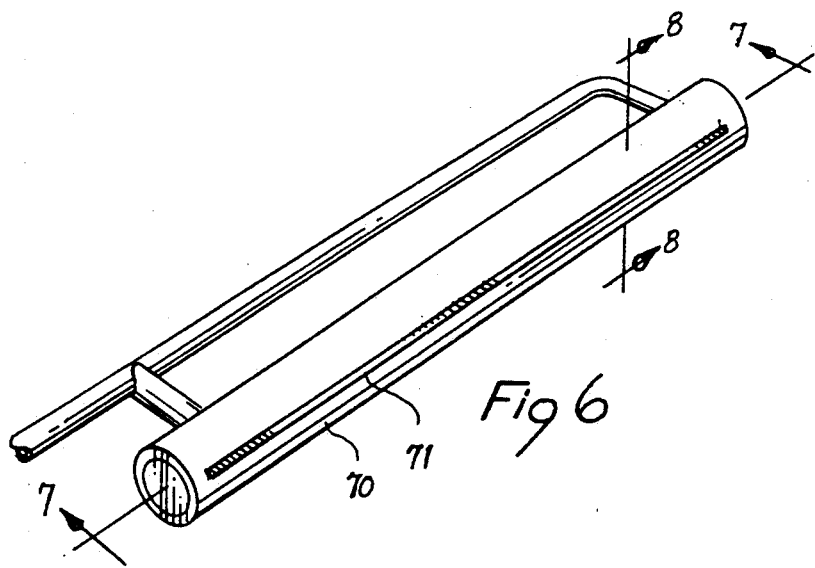
Fig.5
Fig.8
Fig.6
Fig.7

VERTICAL SOLDER COATING APPARATUS

FIELD OF THE INVENTION

This invention relates to solder application techniques and particularly to the application of molten solder to workpieces such as printed circuit boards.

BACKGROUND OF THE INVENTION

Automated solder application apparatus is well known in the circuit board industry. A great variety of systems have been incorporated to automatically apply molten solder to predetermined or selected areas of a printed circuit board; these systems may generally be classified into horizontal and vertical solder machines. U.S. Pat. No. 4,563,974 - Price, discloses both a horizontal and a vertical solder machine and recites and discusses a variety of prior U.S. patents which serve as general background to the present invention.

The prior art solder coating machines have generally successfully achieved the ability to apply a molten solder to a printed circuit board or workpiece; however, substantial difficulty has been encountered in maintaining accuracy of the thickness of the solder coating while achieving economical production rates. Workpieces such as printed circuit boards come in a variety of widths and thicknesses and also in varying degrees of complexity. Some workpieces require great attention to fine detail and intricate patterns for adherence of the solder; further, other sometimes complex circuit boards incorporate numerous small holes extending from one major surface to the opposing surface. Both the intricacy and the fineness of the pattern of the board together with the frequent numerous small "through-holes" can create substantial problems in the solder application technique. Great attention to detail must be exercised to insure the intimate contact of the molten solder with all of the areas to be coated while the holes must not be plugged by the solder. Uniformity of the thickness of the solder coating is important but is difficult to achieve in prior art vertical solder coating machines; the workpieces to be coated are typically clamped by one edge as the coating is being leveled. Clamping the workpiece by one edge frequently results in fluttering of the workpiece as it passes leveling tubes, the resulting solder coating thickness is not uniform. Uniformity of the thickness of the solder coating can sometimes be enhanced in the prior art through the sacrifice of manufacturing speed; however, required efficiencies in the manufacture of printed circuit boards require a more economical throughput in the production of solder coated circuit boards.

It is therefore an object of the present invention to provide an apparatus for the application of solder to workpieces such as circuit boards that is capable of greater production efficiencies than the prior art.

It is another object of the present invention to provide apparatus for the application of solder to workpieces capable of efficiently maintaining consistent control of solder thickness on the workpiece.

It is still another object of the present invention to provide apparatus for the application of molten solder to a workpiece wherein the process utilized by the apparatus may be controlled to more efficiently produce a consistently high quality coated workpiece.

These and other objects of the present invention will become apparent to those skilled in the art as the description proceeds.

SUMMARY OF THE INVENTION

Briefly, in accordance with the embodiment chosen for illustration, a vertical solder coating apparatus is provided with a vertically extending tank having an upper portion containing a glycol-type solder leveling fluid positioned on top of molten solder located in the bottom of the tank. Mounted within the solder leveling fluid are pairs of drive rollers for grasping a workpiece therebetween and forcing the workpiece through the solder leveling fluid into the molten solder. As the workpiece enters the molten solder, it continues downward until it is no longer gripped by the drive rollers; substantially all contact with the workpiece ceases and the workpiece is totally immersed on all sides in the molten solder. The buoyancy of the workpiece traps it in the space formed between the lower drive rollers in contact with each other and maintains an upward pressure on the workpiece to permit it to be grasped by the lowest pair of drive rollers to be lifted from the molten solder through the solder leveling fluid and out of the apparatus. During the transition from the molten solder through the solder leveling fluid, unique leveler tubes are positioned to direct streams of solder leveling fluid against the workpiece to control the thickness of the solder layer deposited thereon and to insure the removal of solder from through-holes in the workpiece. The leveler tubes are designed to provide a uniform stream of solder leveling fluid without the disadvantages of prior art flow gradients existing along the length of the tube. The drive rollers incorporate a slight taper from the outer edges toward the center to permit opposing pairs of drive rollers to grasp the workpiece along only the workpiece's outer edges; no clamps such as those used in vertical soldering machines of the prior art are used and the disadvantages, including production limitations and impingement on quality accompanying the utilization of such clamps, are avoided.

The drive rollers are interconnected so that their speeds are synchronized and are all driven by a reversible variable speed motor that is programmable to independently vary the rate at which the workpiece is lowered through the solder leveling fluid into the molten solder, the dwell time that the workpiece remains in the molten solder, and the speed with which the workpiece is withdrawn from the molten solder through the solder leveling fluid.

BRIEF DESCRIPTION OF THE DRAWINGS

The present invention may more readily be described by reference to the accompanying drawings in which:

FIG. 5 is a side elevational view of the non-driven end of a feed roller assembly;

FIG. 6 is an isometric view a leveler tube, simplified for purposes of description;

FIG. 7 is a cross-sectional view of a portion of FIG. 6 taken along lines 7—7;

FIG. 8 is a cross-sectional view of a portion of FIG. 6 taken along lines 8—8;

FIG. 10b is an end view of the bracket assembly of FIG. 10a;

DETAILED DESCRIPTION OF THE PREFERRED EMBODIMENT

Figure 1:
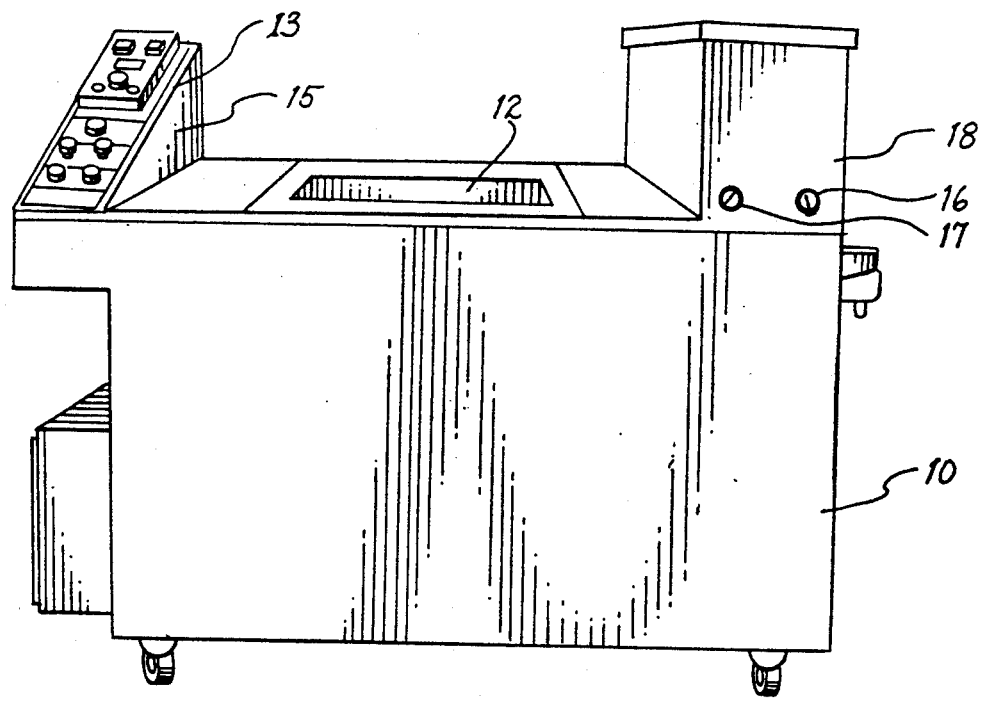
FIG. 1 is a perspective view of a soldering machine incorporating the present invention.

Referring now to FIG. 1, a vertical solder machine 10 is shown in basically the format that would be expected in a commercial embodiment of the present invention. The machine incorporates a workpiece receiving slot 12 at the top thereof and a control panel 13 positioned off to the side of the slot to provide the necessary control input by the system operator. A drive motor is covered by a motor cover 15 for safety purposes; the system may also include appropriate fluid pressure gauges 16 and 17 to provide an indication of the pressure of fluids within the system. The solder leveling fluid pump and the solder pump are located within an enclosure 18.

Referring now to FIGS. 2a, 2b, 2c and 2d, a schematic representation is shown indicating the sequential functions of the apparatus of the present invention. A workpiece such as that shown at 20 is to be solder coated on both sides thereof. The workpiece may for example be a printed circuit board of the type typically found in the electronics industry and which incorporate various plastic materials or resins having exposed copper or other metal areas that are to be solder coated. The system may provide solder coating on one or both sides of the printed circuit board, and the circuit board may be of various sizes. Typically, the printed circuit boards or panels would measure from approximately six inches square to approximately twenty-four inches square. The thickness of the workpiece will also vary and may be as thick as approximately one eighth inch thick. The coating applied to the workpiece by the present system will typically be in the order of two hundred millionths of an inch. Regardless of the thickness of the solder coating, it is important that the coating be uniformly thick and that all of the portions of the workpiece intended to be coated are provided with a suitable solder covering. Further, the workpieces such as printed circuit boards frequently incorporate "through-holes" which are holes extending between the major surfaces of the circuit board. The number and size of these holes sometimes creates difficulties in some solder machines since very small holes tend to become plugged by the applied solder. It is therefore also important to insure that such holes are cleared of any residual solder.

A tank 21 is provided and includes a vertically extending solder dip tank 22 depending therefrom. The tank contains molten solder 23 at the bottom thereof, on top of which is disposed a glycol-type solder leveling fluid 28. The solder is heated and maintained in the molten state using conventional heating techniques. Solder leveling fluids are well known in the industry and are multipurpose fluids. The fluid is heated through contact with the molten solder and operates as a preheating system to preheat the workpiece to enable the latter to better accept solder, and also operates to insulate the molten solder from the air to prevent formation of an oxide layer thereon. Further, the fluid insulates the workpiece from the air as solder is being applied to prevent oxidation of the solder at the time of its application to the workpiece. Upper, middle and lower drive roller pairs 25, 26 and 27, respectively, are provided to grasp the workpiece and lower it through the solder leveling fluid into the molten solder.

Figures 2A, 2B, 2C, 2D:
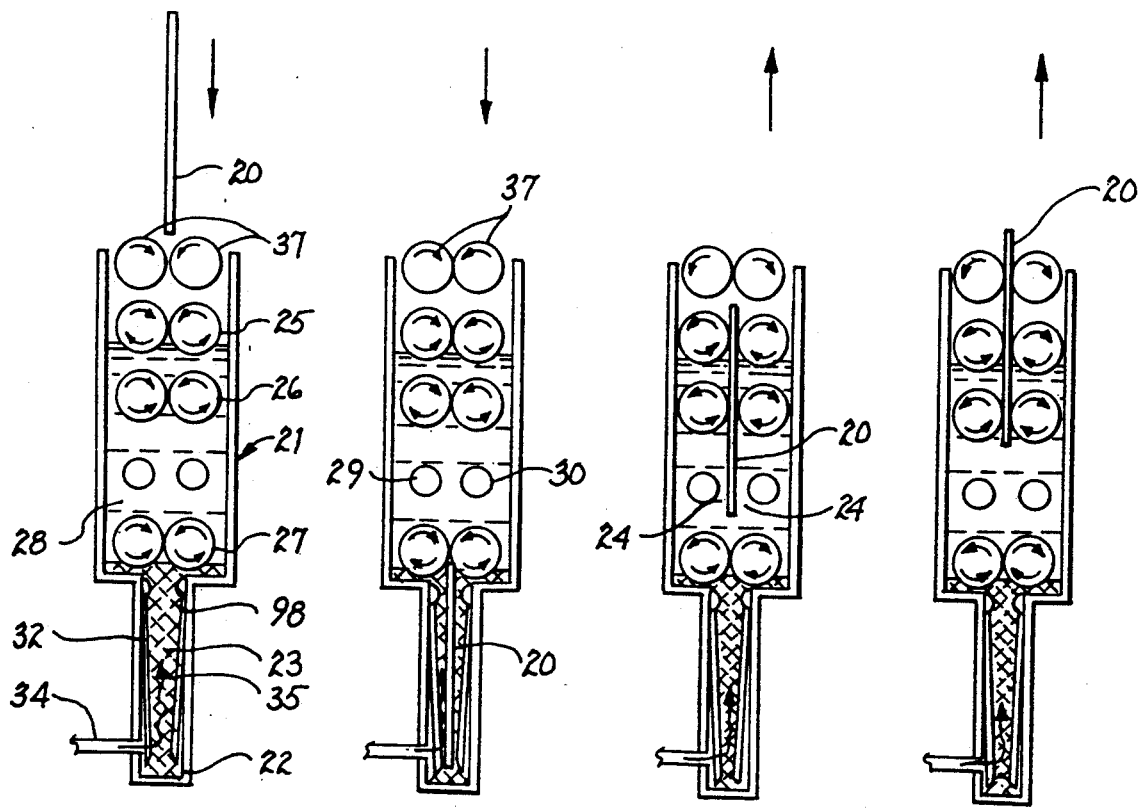
FIGS. 2a, 2b, 2c and 2d are sequential functional diagrams useful for describing the operation of the present invention.

As described above, the solder leveling fluid operates to preheat the circuit board or workpiece as it is being lowered through the tank into the molten solder contained in the solder dip tank 22. As shown in FIG. 2b, the workpiece has been driven through the solder leveling fluid into the molten solder. The workpiece is lighter than the displaced solder, and it is therefore buoyant and attempts to rise from within the solder. However, the workpiece is held submerged within the molten solder for a predetermined dwell time. The workpiece is not clamped or otherwise grasped during the dwell time but relies upon its buoyancy to urge it into contact with the lower drive rollers 27. The narrow construction of the solder dip tank 22, assisted by a guide bracket assembly (to be described) maintains the workpiece essentially vertical during the dwell time. Upon expiration of the appropriate dwell time, the drive rollers are reversed and the workpiece is withdrawn upwardly through the solder leveling fluid. A pair of leveler tubes 29 and 30 are provided, each having a slot or slots therein and each supplied with solder leveling fluid under pressure to direct a stream of the fluid such as shown by the arrows 24 upon the newly solder coated surfaces of the workpiece 20. A pair of non-driven idling rollers 37 are positioned above the upper drive roller pair 25 for leveling any minor surface irregularities in the deposited solder as the workpiece is withdrawn from the molten solder.

The fluid directed from the leveler tubes impinge on the surfaces of the workpiece to remove excess solder and control the thickness of the deposited solder on the workpiece as it is being withdrawn from the molten solder dip tank 22. The utilization of leveling tubes is known in the art; however, it is important to note that the workpiece is grasped by corresponding pairs of drive rollers and is thus firmly grasped and supported during its travel past the leveler tubes to permit a more accurate adjustment of the solder coating thickness.

As will be discussed in more detail herein, the speed of emersion of the workpiece into the molten solder, the dwell time for the specific printed circuit board within the molten solder, and the withdrawal speed of the printed circuit board from the molten solder and through the solder leveling fluid, are all important parameters to achieve maximum throughput, and thus efficiency, while maintaining accuracy in solder thickness and complete solder coating of all parts intended to be coated. The support of the printed circuit board by the drive rollers as the leveler tubes direct impinging streams of solder leveling fluid on the surfaces thereof, combined with control of the emersion speed, withdrawal speed, and dwell time achieve the accuracy and efficiency unobtainable with prior art systems.

Pressurized solder leveling fluid is provided to the leveler tubes 29 and 30 through feed tubes 60 and 61 (to be described later in connection with FIG. 4). The fluid under pressure supplied to the leveler tubes is taken from a convenient location in the system such as the tank 21 and recirculated. The solder leveling fluid is supplied to the leveler tubes at an appropriate pressure to insure suitable flow from the slot of the tubes onto the surface of the workpieces. Typically, a pressure supplied to the leveler tubes through the feed tubes is between two and seven psig. Molten solder within the solder dip tank 22 is fed to the dip tank through a supply tube 34 at the bottom of the dip tank. Solder flows upwardly within the dip tank as shown by the arrow 35 and subsequently is removed from a top location within the solder dip tank for recirculation. While the specific locations of the input and removal of the molten solder within the solder dip tank are not particularly important, the upward flow of the molten solder within the dip tank enhances the thorough coating of the workpiece in a manner to be described more fully hereinafter in connection with the guide bracket 32.

Figure 3A:
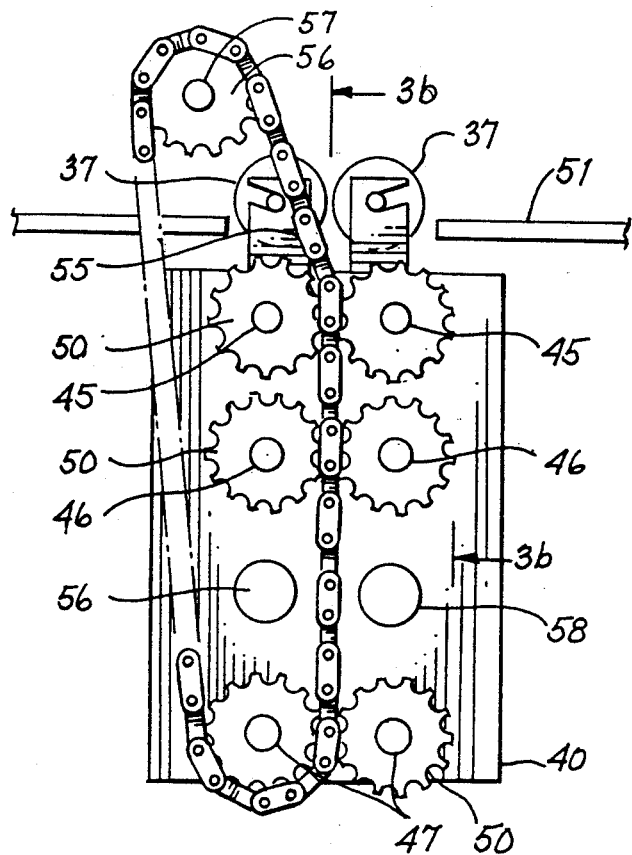
FIG. 3a is a side elevational view of the driven end of a feed roller assembly incorporated in the present invention.
Figure 3B:
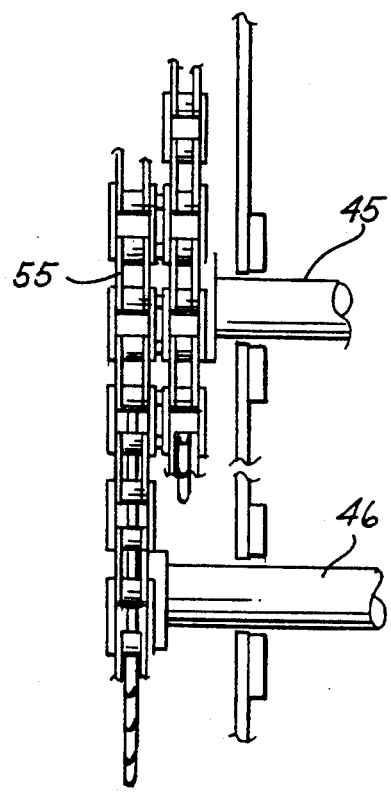
FIG. 3b is a sectional view of the assembly of FIG. 3a taken along line line b—b.
Figure 4:
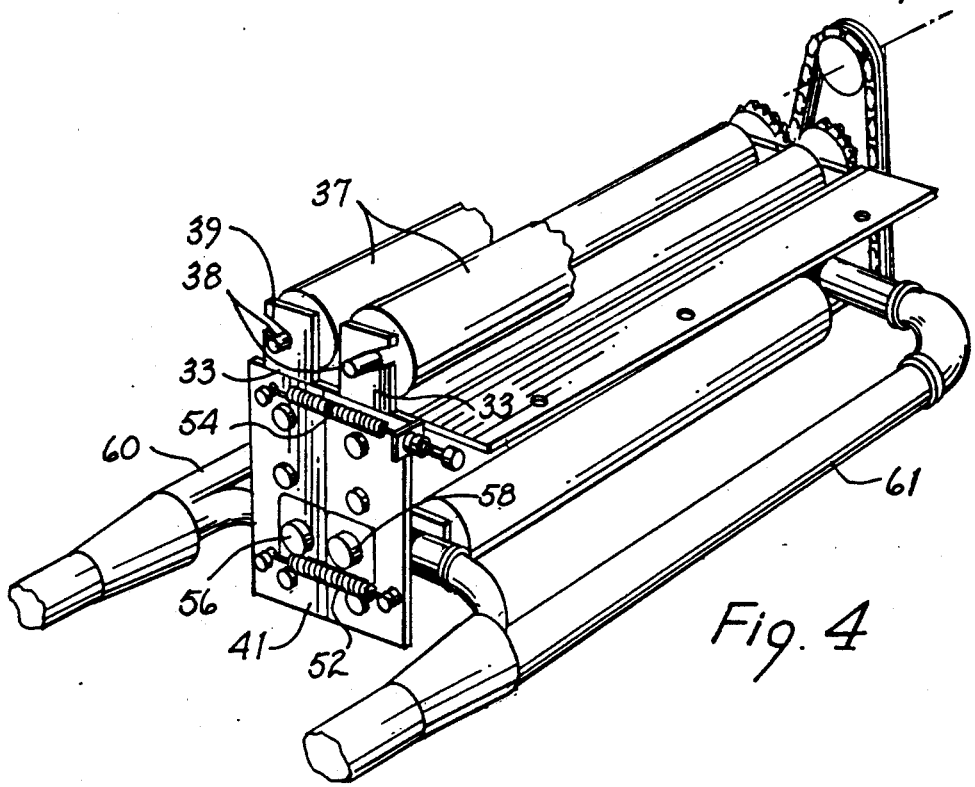
FIG. 4 is a partial three quarter isometric view of a feed roller assembly showing the non-driven end thereof and showing feed tubes for supplying solder leveling fluid to the leveler tubes.

Referring now to FIGS. 3a, 3b, 4, and 5, FIG. 3a shows a side elevational view of a driven end of the feed roller assembly of the present invention. FIG. 4, which will be described in connection with FIGS. 3a and 3b, shows a three quarter isometric view of the feed roller assembly illustrating the non-driven end of the roller assembly and showing feed tubes for supplying solder leveling fluid to the leveler tubes. FIG. 5 is a side elevational view of the non-driven end of the feed roller assembly; that is, the opposite end of the feed roller assembly of FIG. 3a. The upper, middle and lower pairs of drive rollers 25, 26 and 27, respectively, of FIG. 2 are mounted for rotation on shafts 45, 46 and 47, respectively. The drive rollers are driven through drive roller sprockets such as those shown at 50. The sprockets 50 contact and are driven by a dual chain 55 which in turn is driven by sprocket 56 secured to a drive shaft 57 driven by a variable speed reversible electric motor (not shown in FIGS. 3 or 4). The motor may be mounted on the surface 51 of the machine 10 under the enclosure 15 (FIG. 1). The speed, direction, and pause or dwell time during emersion of the workpiece is controlled by conventional and commercially readily available components. The variables above discussed are programmable by the operator through the control panel. The mounting plates 40 and 41 are each vertically divided into two halves, each half supporting one of each pair of drive rollers. Thus, each pair of drive rollers may be forced into contact with each other or may be separated such as by inserting a workpiece therebetween. Biasing means such as springs 52 and 54 urge the halves of the mounting plates 40 and 41 toward each other, thus urging each pair of rollers towards each other to grasp a workpiece placed therebetween. In this manner, workpieces of different thicknesses may be grasped by the drive rollers and transported into and out of the system.

Leveling tubes 29 and 30, the ends of which are shown in FIGS. 3 and 4, at 56 and 58, respectively, are also secured to opposing halves of the mounting plates 40 and 41. In this manner, the leveling tubes are fixed with respect to the drive rollers mounted on a corresponding half of the mounting plates 40 and 41. Thus, leveling tube 30, the end of which is shown at 58, will maintain a fixed distance with respect to the drive rollers on its side of the mounting plate halves and will therefore maintain a fixed distance with respect to the surface of any workpiece being contacted by those drive rollers. Therefore, as the workpiece is transported past the leveler tubes, the distance from the leveler tubes to the workpiece surface remains constant without regard to the thickness of the workpiece and thus provides a means for maintaining accurate control over the thickness of the solder coating on the workpiece.

The leveler tubes are provided with solder leveling fluid through feed tubes 60 and 61. Since the respective halves of the mounting plates 40 and 41 will be forced apart by the thickness of workpieces being transported thereby, the connection supplying solder leveling fluid to the feed tubes 60 and 61 will therefore also have to be flexible. However, the distances required for the respective halves of the mounting plates 40 and 41 to move apart to accommodate the thickness of a printed circuit board is so slight in comparison to the overall size of the feed rollers and feed roller assembly that the necessary flexible connection is of little moment in the mechanical design of the apparatus.

Similarly, the dual drive chain 55 is provided to enable the sprockets at the ends of the respective drive rollers to be driven thereby and to permit slight movement of the driven sprockets toward and away from the chain to accommodate the slight movement of the drive rollers away from each other to accommodate the thickness of a printed circuit board. Again, the thickness of a printed wiring board being transported by the drive rollers does not impart sufficient motion of opposing drive rollers away from each other to interfere with the mechanical interaction of the dual drive chain 55 and sprockets 50. The non-driven idling rollers 37 are mounted for rotation about their respective axial shafts 38 which are rotatably supported in inclined slots 39 machined within mounting brackets 33. The idling rollers 37 are not driven and are not spring biased toward one another. Rather, the inclined slots 38 permit the weight of the respective idling roller to urge the roller toward the opposing idling roller. The idling rollers 37 are polished stainless steel and contact opposing surfaces of the workpiece as it is withdrawn from the solder leveling fluid. The weight of the idling rollers is sufficient to apply a slight compression force therebetween to apply a uniform pressure across the surface of the workpiece to thereby level any minor surface irregularities.

Referring now to FIGS. 6, 7 and 8, the leveler tubes incorporated in the system of the present invention will now be described in greater detail. FIG. 6 is an isometric view, simplified for purposes of description, showing a leveler tube 70 having a slot 71 extending along the length of the tube for directing a flow of solder leveling fluid onto an adjacent workpiece surface. A single slot 71 is shown in FIG. 6 although it will be apparent that multiple slots may be used under certain circumstances. The leveling tube 70 is shown as a cylindrical tube; however, other cross-sectional configurations could be utilized so long as a slot is provided for directing the solder leveling fluid onto the surface of an adjacent workpiece. The leveler tube 70 is provided with solder leveling fluid through a feed tube 72 which, in the embodiment chosen for illustration, provides pressurized solder leveling fluid to both ends of the leveler tube. When the leveler tube is fed solder leveling fluid from both ends as shown in FIG. 6, it has been found that the highest pressure of the fluid within the tube is in the middle thereof. The lowest pressure will be at the ends. Accordingly, flow emanating from the slot 71 would normally be greater in the middle than at the ends; however, in accordance with the present invention, flow modification is achieved to create a uniform flow of emitted solder leveling fluid to produce a uniformly thick solder coating. To modify the flow, a perforated flow directing control plate 73 is mounted within the tubular leveling tube 70. The flow direction control plate 73 is provided with holes or openings 74 extending therethrough; the thickness of the perforated flow direction control plate 73 will depend upon the internal diameter of the leveler tube 70. The thickness of the plate 73 is intended to give sufficient length to the respective openings or holes 74 to ensure that the solder leveling fluid forced therethrough from the interior of the leveler tube 70 through the slot 71 exits from the slot 71 in a direction generally radially of the axis of the leveler tube 70. That is, as the fluid enters the leveler tube, it flows essentially longitudinally thereof until it exits the slot 71. The flow direction control plate 73 is intended to change the direction of the fluid and to impose a 90° direction change from axially within the leveler tube 70 to generally radially outwardly through the slots 71.

The above described pressure gradient existing within the leveler tube along its length is compensated by the use of, a flow balancing or flow distribution plate 75. The flow distribution plate is mounted within the leveler tube 70 and positioned adjacent the flow direction control plate 73. The shape of the flow distribution plate 75, and its position with respect to the direction control plate 73 modifies the flow of solder through the slot 71. The direction control plate 73 and flow distribution plate 75 may be maintained in place within the leveler tube 70 by means of set screws such as that shown at 77.

The planar shape of the flow distribution plate 75 may be modified to accommodate specific tube designs; however, for a leveler tube receiving solder leveling fluid at both ends thereof, a distribution plate roughly approximating an elongated diamond shape such as that shown in FIG. 7 has been found satisfactory. In FIG. 7, the openings 74 that have been shrouded or blocked by the distribution plate 75 are shown as black to distinguish them from the holes that remain unblocked. The combination of the slot 71 extending along the length of the leveler tube 70, the flow directing control plate 73, and the flow distribution plate 75 produces a uniform flow exiting the slot 71 that permits heretofore unobtainable uniformity in the solder coating on workpieces when operating solder coating systems at commercially viable production volume.

The drive rollers of the present invention are knurled to assist grasping workpieces in contact therewith. The system of the present invention does not utilize a prior art clamp or such means for grasping or holding a workpiece as it is being transported into and out of the leveling fluid or molten solder. To permit the drive rollers to contact a minimum area on each workpiece, and to accommodate varying widths and thicknesses of such workpieces while maintaining such minimum contact, the drive rollers are tapered.

Figure 9:
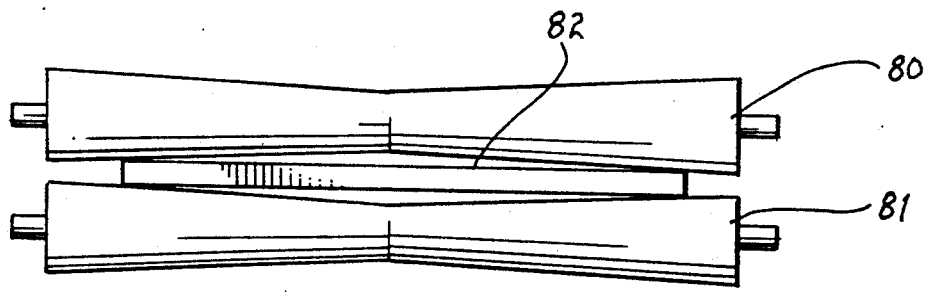
FIG. 9 is a top view of a pair of opposing drive rollers in contact with a printed circuit board being driven thereby and illustrating the roller taper.

Referring now to FIG. 9, a top view of a pair of opposing drive rollers 80 and 81 are shown in contact with a workpiece such as a printed circuit board 82 being driven thereby. Each of the drive rollers 80 and 81 are tapered from a maximum diameter at the respective outer edges thereof to a minimum diameter at the center thereof. It may be seen, that the taper provided to each of the drive rollers permits the workpiece 82 to be grasped only along the workpiece edges. Further, increasing or decreasing the width or thickness of the workpiece 82 will not change the relationship of the drive rollers to the workpiece and will still permit the workpiece to be grasped only along opposite edges thereof. In practice, it has been found that a very slight taper is sufficient; for example, using a two inch diameter drive roller that is twenty-four to twenty-six inches in length, a taper of four thousandths of an inch per inch from a maximum diameter at the outer edges thereof to a minimum diameter toward the center thereof is sufficient. Further, it may not be necessary to taper the drive roller completely to the center thereof since the minimum width of a printed circuit board seldom dictates that the center two or three inches of the drive roller be tapered. The taper is determined by the minimum thickness and width of the workpieces to be processed so that the printed circuit boards being gripped by the drive rollers are gripped only along the workpiece edges.

As described above, an important feature of the invention is the ability of the system to maintain a desired distance between the leveler tube and the surface of a workpiece as the latter travels past the leveler tube. It will be apparent to those skilled in the art that some slight modification of this distance will be encountered as a result of the taper of the drive rollers. However, it will also be apparent to those skilled in the art that the variations in this distance caused by the eight thousandths of an inch taper to the drive rollers will cause a slight variation in the spacing between the rollers of a pair depending upon the thickness and width of a workpiece; however, this variation is insignificant and the distance from the surface of a workpiece to the leveler tube, as it passes during operation, is for all manufacturing purposes constant.

Figure 10A:
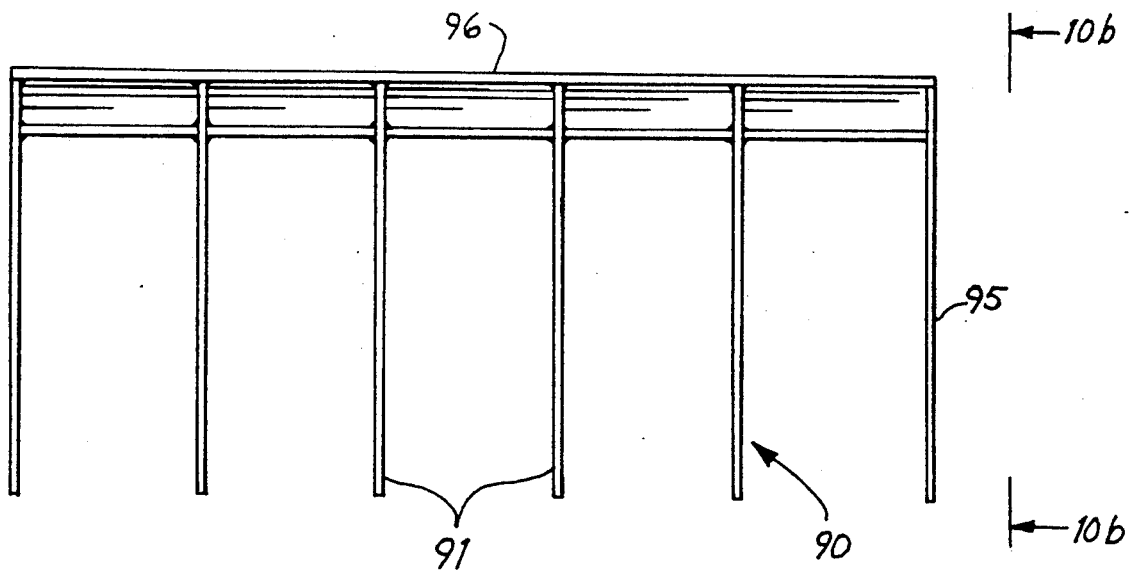
FIG. 10a is a side elevational view of a guide bracket assembly for guiding boards into and out of molten solder.
Figure 10B:
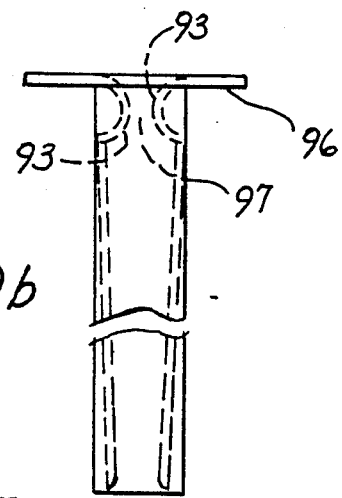
Figure 11:
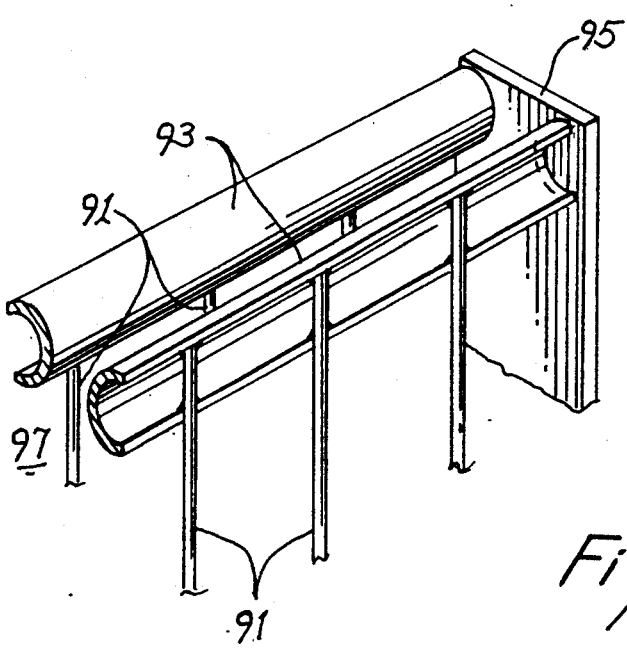
FIG. 11 is an isometric view, partly in section, of a portion of the guide bracket assembly of FIGS. 10a and 10b.

As described in connection with FIGS. 2a through 2d, a printed circuit board lowered into the solder dip tank of the apparatus of the present invention is maintained essentially vertical; the only force tending to raise the workpiece during its emersion in the molten solder is the buoyancy of the workpiece. Referring to FIGS. 10 and 11, a guide bracket assembly 90 is shown incorporating a plurality of vertically extending guide rods 91 each secured at its upper end to channel members 93. The channel members 93 are secured at each end thereof to an end plate 95; the assembly may incorporate a top plate 96 having an opening or slot extending therealong to permit a printed circuit board to be lowered into the bracket assembly between the channel members 93. It may be noted that the channel members 93 form a flow restriction channel 97 therebetween for purposes to be described below. The guide bracket assembly of FIGS. 10 and 11 is placed within the solder dip tank such as that shown in FIG. 2 with the guide rods 91 extending vertically down into the solder dip tank and with the flow restriction channel 97 positioned in an area designated by the reference numeral 98 in FIG. 2a. The guide bracket assembly thus permits the printed circuit board to be lowered or forced into the solder dip tank through the flow restriction channel 97. As the workpiece remains immersed, the guide rods 91 insure that the circuit board remains in essentially vertical position and that the upper edge thereof remains aligned with the junction of the lower drive rollers. Since the molten solder is fed into the lower portion of the solder dip tank and flows upwardly therein as indicated by the arrow 35 in FIG. 2a, the solder, in its upward flow, encounters the flow restriction channel 97 that also contains the immersed printed circuit board. The resulting increased flow velocity over the surfaces of the workpiece in the flow restriction channel 97 enhances the thorough coating of the workpiece surface and insures that even minute portions and intricate designs on the workpiece are appropriately solder coated.

Figure 12:
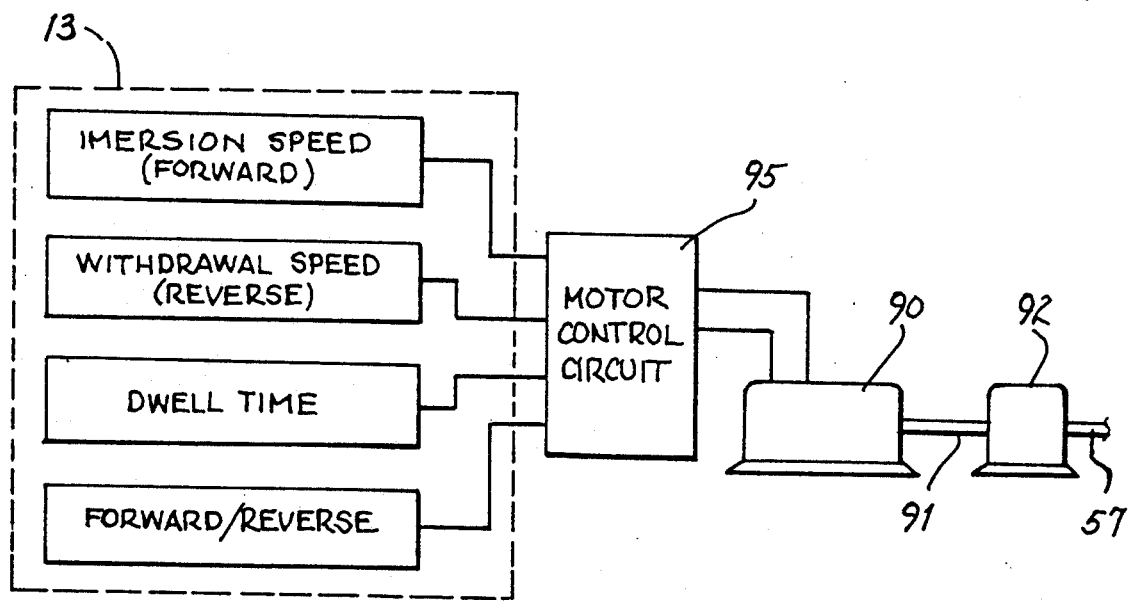
FIG. 12 is a functional block diagram of a motor control system incorporated in the present invention.

Referring to FIG. 12, a functional block diagram of the motor control system incorporated in the apparatus of the present invention is shown. An electric motor 90 is shown driving an output shaft 91 connected to a gear reduction unit 92 for ultimately powering the drive shaft 57, the drive shaft 57 is that shaft connected to the drive sprocket 56 in FIG. 3a for powering the dual drive chain 55 and ultimately rotating the respective drive rollers of the system. The components utilized in the control system of FIG. 12 may be conventional analog controls or may be digital controls providing signals to a conventional digital motor control circuit incorporating an appropriate digital-to-analog converter for the application of analog signals to the electric motor. As stated previously, the speed with which the workpiece or printed circuit board is immersed in the solder leveling fluid and the molten solder may vary. This speed variation is achieved by controlling the motor speed through a motor control circuit 95 operating in accordance with operator selected settings derived from the control panel 13. The operator may select the emersion speed (forward speed of the electric motor) by selecting appropriate switch settings on the control panel, which settings will be utilized by the motor control circuit to operate the electric motor 90 at an appropriate speed to drive the output drive shaft 57 and thus the rotational speed of the drive rollers in contact with the workpiece. Similarly, the dwell time, or emersion time, for the workpiece to remain in the molten solder can be selected by the operator by selecting an appropriate dial setting on the control panel. The speed with which the workpiece is withdrawn from the solder dip tank and passed by the leveler tubes may also be selected at the control panel by the operator.

Thus, it may be seen that the emersion speed, withdrawal speed, and dwell time are independently controlled. Typical printed circuit boards may frequently require an emersion period of approximately four seconds; however, with more complex boards such as multi-layered boards, an emersion of approximately eight seconds is more appropriate. Being able to independently control the speed of withdrawal as opposed to the speed of emersion and to independently control the dwell time insures quality and dependability of the solder coated workpiece. For example, some printed circuit boards contain numerous extremely small holes that become plugged with molten solder when immersed, for proper operation of the board it is necessary that the solder be cleared from these holes. Under such circumstances, a slower withdrawal speed permits the board to be subjected to the action of the leveler tubes for a longer period of time to insure clearing of the holes. In those instances where the printed circuit board is very simple and includes only a few holes, production times can be reduced by increasing the withdrawal speed.

It may therefore be seen that the present invention provides a system for accepting a variety of workpieces, such as printed circuit boards, having various widths and thicknesses and permits the workpieces to be fed into a solder leveling fluid and subsequently into a dip tank of molten solder. The workpieces are free from clamps and are substantially uncovered during the emersion in the molten solder. The withdrawal of the workpiece from the molten solder is achieved by reversible drive rollers that contact the workpiece at only the vicinity of opposing edges while firmly supporting the workpiece as it is subjected to the streams of solder leveling fluid emanating from the leveler tubes positioned adjacent either major surface of the workpiece. During the emersion of the workpiece, molten solder flows over the surfaces thereof and as the workpiece is withdrawn, the solder flows upwardly in the dip tank through a partially restricted channel at the top of the dip tank and adjacent the surfaces of the workpiece to insure that the molten solder is forced into intimate contact with the entire area of the workpiece. The emersion speed, the time that the workpiece is maintained in the molten solder or dwell time, and the withdrawal speed are all independently controlled to insure complete coverage of the major surfaces of the workpiece while establishing uniformity of the solder coating thickness through the utilization of the leveler tubes.

In operation, the operator will enter the appropriate speeds for emersion and withdrawal as well as the appropriate dwell time into the control panel of the apparatus of the present invention, the workpiece is then inserted in the receiving slot where it engages the upper pair of drive rollers and is conveyed downwardly into the solder leveling fluid. The transition through the heated solder leveling fluid preheats the workpiece before it enters the molten solder in the dip tank at the bottom of the apparatus fluid tank. The speed with which the workpiece is lowered determines the time of exposure of the workpiece to the beneficial effects, such as preheating, created by the solder leveling fluid. It is important to note that the workpiece is grasped only along opposing edges thereof by the knurled and tapered drive rollers of the present invention. The drive rollers will contact the workpiece in this manner throughout its broad range of expected workpiece sizes.

The workpiece is thus forced into the molten solder in the solder dip tank and is maintained in the immersed state for the predetermined dwell time determined by the operator prior to the beginning of the operation. During its emersion, molten solder flows upwardly on both sides of the workpiece to coat the workpiece. At the end of the dwell time, the drive rollers are reversed and the force exerted by the buoyancy of the workpiece within the molten solder permits the lowest pair of drive rollers to grasp the workpiece and withdraw it from the molten solder into the solder leveling fluid. As the workpiece is withdrawn upwardly, it passes through the restricted area at the top of the dip tank to thereby insure intimate contact between the molten solder and the surfaces of the workpiece. It is important to note that the withdrawal speed is also variable independently of the dwell time and the emersion speed. This latter feature is important in those instances requiring a greater time for the workpiece to be subjected to the streams of solder leveling fluid emanating from the leveler tubes. The latter condition is frequently necessary in those instances wherein the workpiece incorporate numerous small through-holes and the apparatus must insure that the solder is removed from these holes before the workpiece may be withdrawn. It is also important to note that the workpiece is grasped along opposing edges by the drive rollers as it is being subjected to the leveling effects of the solder leveling fluid flowing from the leveler tubes onto the surfaces thereof. The firm support as the workpiece is being withdrawn past the leveling tubes permits significantly greater accuracy than heretofore available in vertical soldering machines incorporating clamps.

It will be obvious to those skilled in the art that many modifications may be made in the specific details incorporated in the embodiment chosen for illustration without departing from the spirit and scope of the invention. For example, while the apparatus has been described in terms of workpieces such as printed circuit boards, it should be understood that the apparatus has equal utility to other types of products that are to be solder coated and generally planar in form. As used herein, the terms "solder leveling fluid" and "solder" are intended to include substances and compounds of those types used in the solder coating industry and should not be limited to any particular solder leveling fluid or solder alloy or mixture.

What is claimed is:

1. An improved soldering apparatus for applying solder to a workpiece such as a printed circuit board comprising:
   (a) a vertically extending tank for containing molten solder and a bath of solder leveling fluid on top thereof;
   (b) at least one pair of rollers positioned in said tank to grasp said workpiece therebetween for lowering said workpiece substantially vertically through said solder leveling fluid into said molten solder and for raising said workpiece out of said molten solder through said solder leveling fluid;
   (c) at least one leveling tube mounted in said tank and positioned within said bath to direct a stream of solder leveling fluid onto said workpiece as it is being raised out of said molten solder and while it is grasped by said rollers for leveling molten solder adhering to said workpiece; and
   (d) at least one of said rollers of said pair of rollers being tapered from a maximum diameter at an outer edge thereof to a minimum diameter toward the center thereof to permit grasping workpieces between said pair of rollers only along the workpiece edges.

2. The combination set forth in claim 1 wherein said leveling tube comprises an elongated tubular member having a slot therein extending along its length for directing a flow of solder leveling fluid onto an adjacent workpiece surface, and wherein said leveling tube includes flow directing means mounted within said tubular member and adjacent said slot for directing fluid from within said tubular member substantially radially through said slot, and a flow distribution means mounted within said tubular member and adjacent said directing means for modifying the flow of solder leveling fluid along said slot.

3. The combination set forth in claim 1 wherein said tank includes flow restriction means adjacent the top of said molten solder in said tank and positioned on opposite sides of an immersed workpiece to restrict upward flow of molten solder as said workpiece is withdrawn from said solder to increase molten solder flow velocity past said workpiece as it is withdrawn.

4. The combination set forth in claim 1 including a guide bracket assembly positioned within said molten solder for maintaining workpieces in a vertical position when emersed in said molten solder.

5. An improved soldering apparatus for applying solder to a workpiece such as a printed circuit board comprising:
   (a) a vertically extending tank for containing molten solder and a bath of solder leveling fluid on top thereof;
   (b) at least one pair of rollers positioned in said tank to grasp said workpiece therebetween for lowering said workpiece substantially vertically through said solder leveling fluid into said molten solder and for raising said workpiece out of said molten solder through said solder leveling fluid;
   (c) at least one leveling tube mounted in said tank and positioned within said bath to direct a stream of solder leveling fluid onto said workpiece as it is being raised out of said molten solder and while it is grasped by said rollers for leveling molten solder adhering to said workpiece;
   (d) mounting means for rotatably supporting said pair of rollers and including biasing means for yieldably urging the rollers of said pair of rollers toward each other to grasp a workpiece therebetween; and
   (e) means securing said leveling tube to said mounting means to thereby maintain a fixed distance with respect to one of said rollers and with respect to a workpiece contacting said one of said rollers.

6. The combination set forth in claim 5 wherein said drive rollers are journaled in mounting plates for rotation about the respective axis of said drive rollers and wherein said leveling tube is secured to said mounting plates to thereby maintain a fixed distance with respect to any workpiece surface contacting one of said rollers.

7. An improved soldering apparatus for applying solder to a workpiece such as a printed circuit board comprising:
   (a) a vertically extending tank for containing molten solder and a bath of solder leveling fluid on top thereof;
   (b) a first and a second pair of opposing drive rollers positioned in said tank to grasp said workpiece between respective pairs of rollers for lowering said workpiece substantially vertically through said solder leveling fluid into said molten solder and for raising said workpiece out of said molten solder through said solder leveling fluid;
   (c) a pair of opposing leveling tubes mounted in said tank and positioned within said bath between said first and second pairs of drive rollers for directing a stream of solder leveling fluid onto opposing sides of said workpiece as it is being raised out of said molten solder and while it is grasped by said rollers; and
   (d) each of said rollers of pairs of rollers being tapered from a maximum diameter at an outer edge of said roller to a minimum diameter toward the center of said roller to permit grasping workpieces between said pairs of rollers only along the workpiece edges.

8. The combination set forth in claim 7 wherein each of said leveling tubes comprises an elongated tubular member having a slot therein extending along its length for directing a flow of solder leveling fluid onto an adjacent workpiece surface, and wherein said leveling tube includes flow directing means mounted within said tubular member and adjacent said slot for directing fluid from within said tubular member substantially radially through said slot, and a flow distribution means mounted within said tubular member and adjacent said directing means for modifying the flow of solder leveling fluid along said slot.

9. The combination set forth in claim 7 including mounting means for rotatably supporting said pair of rollers and including biasing means for yieldably urging the rollers of said pair of rollers toward each other to grasp a workpiece therebetween; and including means securing said leveling tube to said mounting means to thereby maintain a fixed distance with respect to one of said rollers and with respect to a workpiece contacting said one of said rollers.

10. The combination set forth in claim 7 wherein said drive rollers are journaled in mounting plates for rotation about the respective axis of said drive rollers and wherein said leveling tubes are secured to said mounting plates to thereby maintain a fixed distance with respect to any workpiece surface contacting said rollers.

11. In a vertical soldering apparatus for applying solder to a workpiece and having a vertically extending tank containing molten solder and a bath of solder leveling fluid on top thereof, the improvement comprising: at least one pair of drive rollers for grasping said workpiece therebetween for lowering said workpiece into said molten solder and raising said workpiece out of said molten solder; each of said rollers being tapered from a maximum diameter at an outer edge thereof to a minimum diameter toward the center thereof to permit grasping workpieces between said rollers only along the workpiece edges.

* * * * *